(12) United States Patent
Yu et al.

(10) Patent No.: US 12,482,771 B2
(45) Date of Patent: Nov. 25, 2025

(54) CHIP PACKAGE WITH HIGHER BEARING CAPACITY IN WIRE BONDING

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 385 days.

(21) Appl. No.: 18/206,593

(22) Filed: Jun. 6, 2023

(65) Prior Publication Data

US 2023/0395538 A1 Dec. 7, 2023

(30) Foreign Application Priority Data

Jun. 7, 2022 (TW) .................................. 111121071

(51) Int. Cl.
*H01L 23/00* (2006.01)

(52) U.S. Cl.
CPC ............. *H01L 24/05* (2013.01); *H01L 24/02* (2013.01); *H01L 24/03* (2013.01); *H01L 24/04* (2013.01); *H01L 24/48* (2013.01); *H01L 24/85* (2013.01); *H01L 2224/02313* (2013.01); *H01L 2224/02331* (2013.01); *H01L 2224/02373* (2013.01); *H01L 2224/02375* (2013.01); *H01L 2224/02381* (2013.01); *H01L 2224/03602* (2013.01); *H01L 2224/04042* (2013.01); *H01L 2224/05008* (2013.01); *H01L 2224/05026* (2013.01); *H01L 2224/05082* (2013.01); *H01L 2224/05548* (2013.01); *H01L 2224/05562* (2013.01); *H01L 2224/05567* (2013.01); *H01L 2224/48091* (2013.01); *H01L 2224/48105* (2013.01); *H01L 2224/48464* (2013.01); *H01L 2224/85* (2013.01)

(58) Field of Classification Search
None
See application file for complete search history.

(56) References Cited

U.S. PATENT DOCUMENTS

2023/0395538 A1* 12/2023 Yu ........................... H01L 24/48

* cited by examiner

*Primary Examiner* — Jack S Chen
(74) *Attorney, Agent, or Firm* — Fei-hung Yang

(57) ABSTRACT

A chip package with higher bearing capacity in wire bonding is provided. The chip package includes at least one conductive circuit which is a structure with a thickness ranging from 4.5 μm to 20 μm. Thereby a structural strength of the conductive circuit is improved and able to stand a positive pressure generated in wire bonding or formation of a first bonding point. Thus at least one internal circuit of a chip will not be damaged by the positive pressure and allowed to pass through an area under the first bonding point or arrange under the first bonding point. A problem of increased cost at manufacturing end caused by the internal circuit redesign of the chip can be solved effectively. This is beneficial to cost reduction at manufacturing end.

6 Claims, 12 Drawing Sheets

CHIP PACKAGE WITH HIGHER BEARING CAPACITY IN WIRE BONDING

CROSS-REFERENCE TO RELATED APPLICATIONS

This non-provisional application claims priority under 35 U.S.C. § 119(a) on Patent Application No(s). 111121071 filed in Taiwan, R.O.C. on Jun. 7, 2022, the entire contents of which are hereby incorporated by reference.

BACKGROUND OF THE INVENTION

The present invention relates to a chip package, especially to a chip package with higher bearing capacity in wire bonding.

In a field of chip package, wire bonding technique is used to create electrical connection between chip package and electronic components. One bonding point is formed on the chip package and the other bonding point is formed on the electronic component by a bonding wire so as to form electrical connection between the chip package and the electronic component. However, while performing wire bonding, the chip package available now receives a positive pressure generated in wire bonding or formation of the bonding point and internal circuit of the chip is damaged due to the positive pressure and thus unable to pass through an area under respective pads in the chip or arrange under the pads in the chip. Thereby the internal circuit of the chip needs to be rearranged or redesigned by manufacturers and this leads to higher cost at manufacturing end.

Thus there is room for improvement and there is a need to provide a chip package with higher bearing capacity in wire bonding which addresses the issue of increased cost caused by the internal circuit redesign of the chip.

SUMMARY OF THE INVENTION

Therefore, it is a primary object of the present invention to provide a chip package with higher bearing capacity in wire bonding, which includes at least one conductive circuit. The conductive circuit is a structure with a thickness ranging from 4.5 µm to 20 µm. Thereby a structural strength of the conductive circuit can stand a positive pressure generated in wire bonding or formation of a first bonding point. Thus at least one internal circuit of a chip will not be damaged by the positive pressure and the internal circuit is allowed to pass through an area under the first bonding point or arrange under the first bonding point. A problem of increased cost at manufacturing end caused by the internal circuit redesign of the chip can be solved effectively.

In order to achieve the above object, a chip package with higher bearing capacity in wire bonding according to the present invention includes a chip, at least one dielectric layer, at least one first bump, at least one first protective layer, at least one second dielectric layer, at least one conductive circuit, at least one second bump, at least one second protective layer, and at least one solder mask layer. The chip consists of a first surface and at least one internal circuit. At least one die pad and at least one protective layer are arranged at the first surface. The chip is formed by cutting a wafer. The first dielectric layer composed of a second surface and at least one first groove is disposed on and covering the first surface of the chip correspondingly while the first groove is corresponding to the die pad of the chip. The first bump provided with a third surface is mounted in the first groove of the first dielectric layer, disposed on and electrically connected with the die pad disposed on the chip. The first protective layer having a fourth surface is mounted in the first groove of the first dielectric layer, arranged at and electrically connected with the third surface of the first bump. The second dielectric layer which consists of a fifth surface and at least one second groove is disposed on and covering the second surface of the first dielectric layer while the die pad of the chip is covered by the second groove. The conductive circuit which is provided with a sixth surface is mounted in the second groove of the second dielectric layer and disposed on the second surface of the first dielectric layer, the fourth surface of the first protective layer, and the fifth surface of the second dielectric layer. The conductive circuit is electrically connected with the first protective layer. The second bump which includes a seventh surface and a peripheral edge is mounted to and electrically connected with the sixth surface of the conductive circuit. The second protective layer is provided with an eighth surface and arranged at the seventh surface of the second bump, the peripheral edge of the second bump, and the fifth surface of the second dielectric layer. The second protective layer is electrically connected with the second bump. The solder mask layer is provided with at least one first opening and disposed on the eighth surface of the second protective layer. The first opening of the solder mask layer is used for exposure of the second protective layer. At least one bonding pad is formed on the conductive circuit at an area corresponding to the first opening for external electrical connection. While performing wire bonding, a first bonding point and a second bonding point are respectively formed on the second protective layer and an electronic component by a bonding wire for forming electrical connection between the chip package and the electronic component. A method of manufacturing the chip package according to the present invention includes the following steps. Step S1: providing a wafer which includes a plurality of chips arranged in an array and each of the chips is having a first surface and at least one internal circuit while the first surface is provided with at least one die pad and at least one protective layer; Step S2: disposing at least one first dielectric layer over the first surface of the chip and the first dielectric layer is covering the first surface and provided with a second surface; Step S3: forming at least one first groove on the first dielectric layer and the first groove is corresponding to the die pad of the chip; Step S4: mounting at least one first bump in the first groove of the first dielectric layer while the first bump is disposed on and electrically connected with the die pad of the chip and provided with a third surface; Step S5: disposing at least one first protective layer in the first groove of the first dielectric layer while the first protective layer is not only arranged at and electrically connected with the third surface of the first bump but also provided with a fourth surface; Step S6: arranging at least one second dielectric layer over the second surface of the first dielectric layer while the second dielectric layer is covering the second surface correspondingly and provided with a fifth surface; Step S7: forming at least one second groove on the second dielectric layer and the die pad of the chip is covered by the second groove; Step S8: mounting at least one conductive circuit in the second groove of the second dielectric layer while the conductive circuit is electrically connected with the first protective layer and arranged at the second surface of the first dielectric layer, the fourth surface of the first protective layer, and the fifth surface of the second dielectric layer; Step S9: removing redundant part of the conductive circuit by wire grinding and the conductive circuit is having a sixth surface; Step S10:

disposing at least one second bump over the sixth surface of the conductive circuit while the second bump is electrically connected with the conductive circuit and provided with a seventh surface and a peripheral edge; Step S11: arranging at least one second protective layer over the seventh surface of the second bump while the second protective layer is electrically connected with the second bump, located at the peripheral edge of the second bump, and the fifth surface of the second dielectric layer, and provided with an eighth surface; Step S12: mounting at least one solder mask layer over the eighth surface of the second protective layer; Step S13: forming at least one first opening on the solder mask layer so that the second protective layer is exposed through the first opening of the solder mask layer and at least one bonding pad is formed on the conductive circuit at an area corresponding to the first opening for external electrical connection; Step S14: cutting the plurality of chips of the wafer to separate the respective chip packages from the wafer; Step S15: performing wire bonding on the respective separate chip packages and using a bonding wire to form a first bonding point and a second bonding point respectively on the second protective layer and an electronic component for electrical connection between the chip package and the electronic component.

The conductive circuit is a structure with a certain thickness which is set to 4.5-20 μm. Thereby structural strength of the conductive circuit is improved and able to stand a positive pressure generated in wire bonding or formation of the first bonding point. The internal circuit of the chip will not be damaged by the positive pressure. Thus the internal circuit is further allowed to pass through an area under the first bonding point or arrange under the first bonding point and this is beneficial to cost reduction at the manufacturing end.

Preferably, the thickness of the conductive circuit is set to 4.5-5 μm.

Preferably, the solder mask layer is further provided with a ninth surface while the chip package further includes at least one outer protective layer having a second opening which is communicating with the first opening of the solder mask layer. The outer protective layer is disposed on and covering the ninth surface of the solder mask layer correspondingly the second opening of the outer protective layer is used for allowing the second protective layer to be exposed.

Preferably, a total thickness of the chip package formed by the first dielectric layer, the first bump, the first protective layer, the second dielectric layer, the conductive circuit, the second bump, the second protective layer, the solder mask layer, and the outer protective layer stacked over one another is 25 μm.

Preferably, in the step S12, disposing at least one outer protective layer over a ninth surface of the solder mask layer and the outer protective layer is disposed on and covering the ninth surface of the solder mask layer correspondingly.

Preferably, in the step S13, forming at least one second opening on the outer protective layer when the first opening is formed on the solder mask layer. The first opening and the second opening are communicating with each other.

DETAILED DESCRIPTION OF THE PREFFERED EMBODIMENT

In order to learn structure and technical features of the present invention, please refer to the following descriptions and related FIGS. which are only used to explain relationship and functions of respective components of the present invention and sizes of the respective components are not drawn to real scale, and not intended to limit the scope of the present invention.

Figure 1:
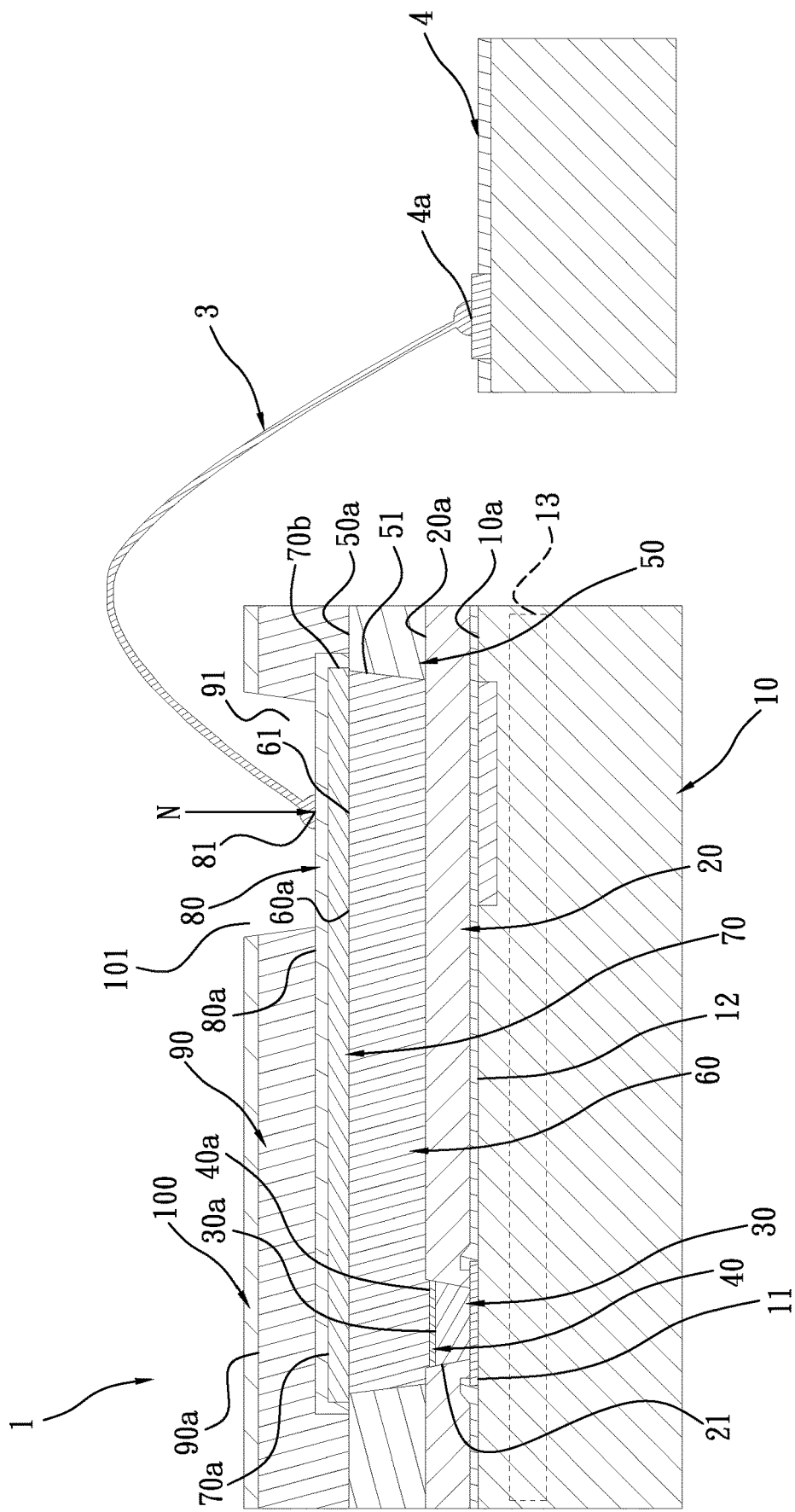
FIG. 1 is a side view of a section of a first embodiment according to the present invention.
Figure 3:
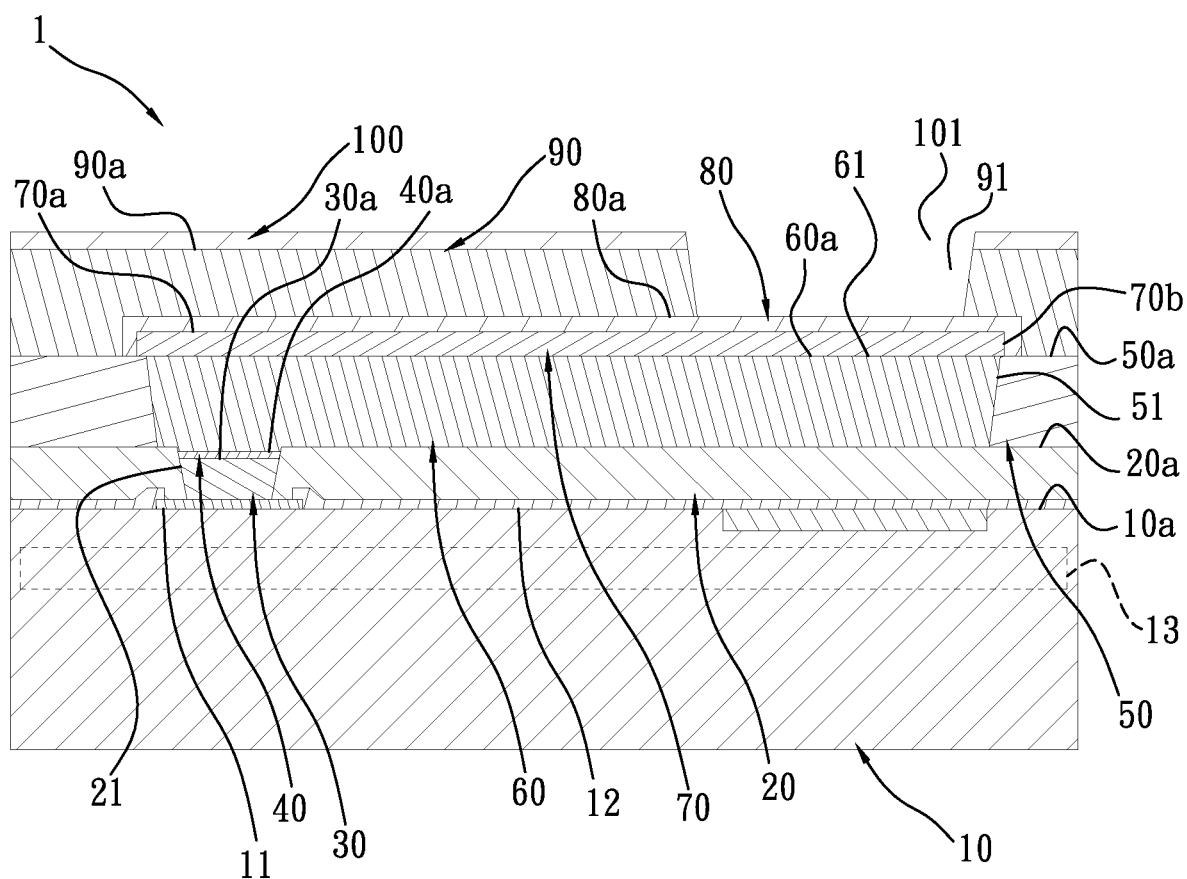
FIG. 3 is a sectional view showing chip packaging of an embodiment according to the present invention.

Refer to FIG. 1 and FIG. 3, a chip package 1 with higher bearing capacity in wire bonding according to the present invention includes a chip 10, at least one dielectric layer 20, at least one first bump 30, at least one first protective layer 40, at least one second dielectric layer 50, at least one conductive circuit 60, at least one second bump 70, at least one second protective layer 80, and at least one solder mask layer 90.

Figure 2:
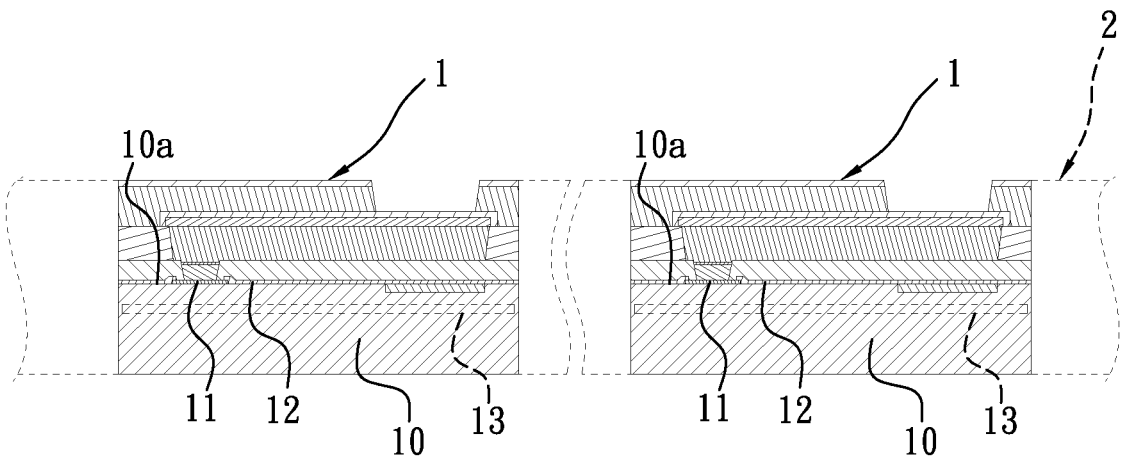
FIG. 2 is a schematic drawing showing a side view of a section of a chip of the first embodiment being cut from a wafer according to the present invention.

The chip 10 consists of at least one internal circuit 13 and a first surface 10a which is provided with at least one die pad 11 and at least one protective layer 12, as shown in FIG. 3. The chip 10 is formed by cutting a wafer 2, as shown in FIG. 2.

Figure 18:
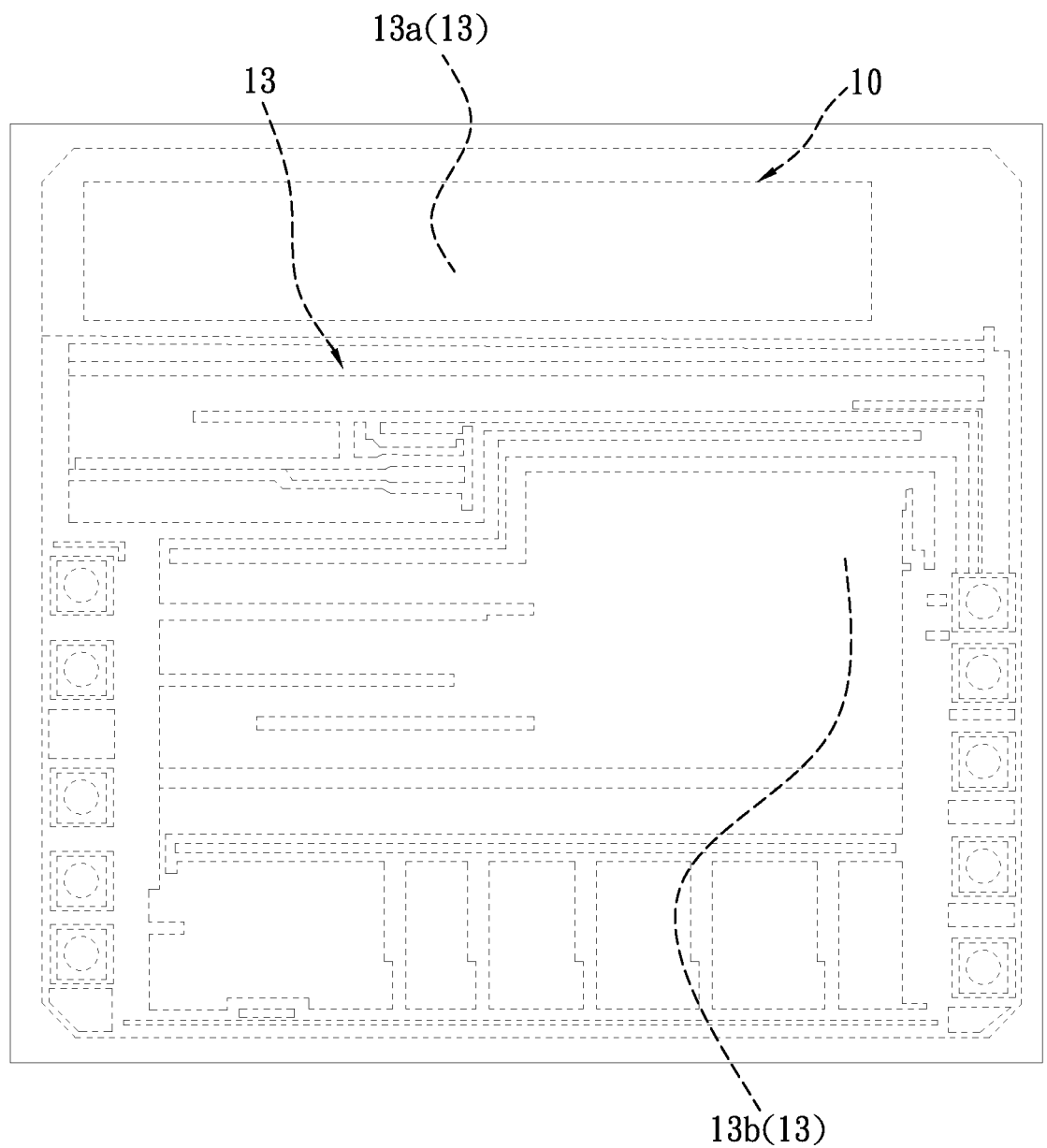
FIG. 18 is a top planar view of internal circuit of an embodiment according to the present invention.
Figure 19:
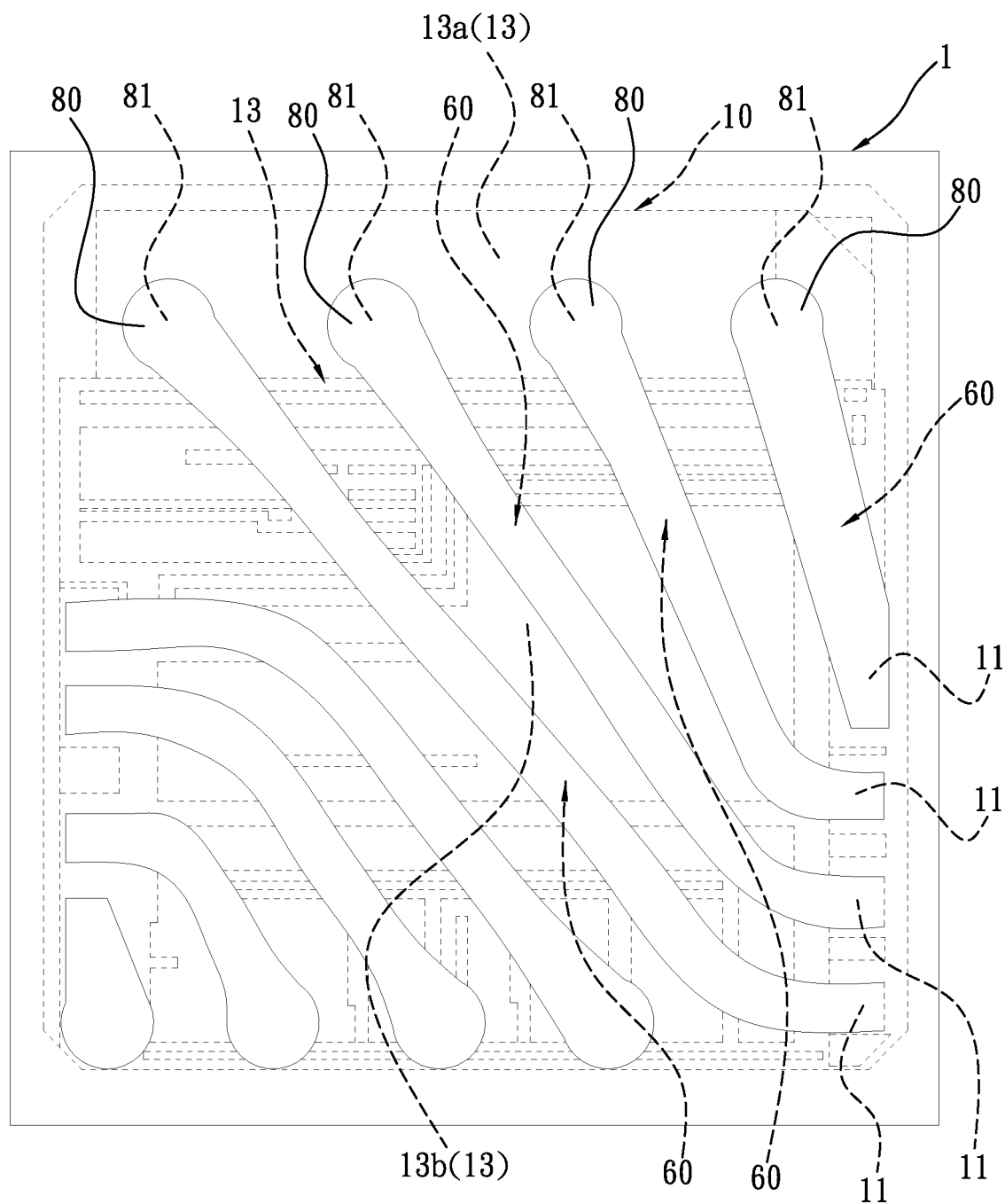
FIG. 19 is a top planar view of a chip package of an embodiment according to the present invention.

As shown in FIG. 18 and FIG. 19, the internal circuit 13 can include an array area 13a and a circuitry area 13b (or circuit cell, not shown in the figures), but not limited.

The first dielectric layer 20 composed of a second surface 20a and at least one first groove 21 is disposed on and covering the first surface 10a of the chip 10 correspondingly and the first groove 21 is corresponding to a position of the die pad 11 of the chip 10, as shown in FIG. 3.

The first bump 30 provided with a third surface 30a is mounted in the first groove 21 of the first dielectric layer 20, disposed on and electrically connected with the die pad 11 of the chip 10, as shown in FIG. 3.

The first protective layer 40 provided with a fourth surface 40a is mounted in the first groove 21 of the first dielectric layer 20, arranged at and electrically connected with the third surface 30a of the first bump 30, as shown in FIG. 3.

The second dielectric layer 50 which consists of a fifth surface 50a and at least one second groove 51 is disposed on and covering the second surface 20a of the first dielectric layer 20 correspondingly while the die pad 11 of the chip 10 is covered by the second groove 51, as shown in FIG. 3.

The conductive circuit 60 which is provided with a sixth surface 60a is mounted in the second groove 51 of the second dielectric layer 50 and disposed on the second surface 20a of the first dielectric layer 20, the fourth surface 40a of the first protective layer 40, and the fifth surface 50a of the second dielectric layer 50. The conductive circuit 60 is electrically connected with the first protective layer 40, as shown in FIG. 3.

The second bump 70 which includes a seventh surface 70a and a peripheral edge 70b is mounted to and electrically connected with the sixth surface 60a of the conductive circuit 60, as shown in FIG. 3.

The second protective layer 80 is provided with an eighth surface 80a and arranged at the seventh surface 70a of the second bump 70, the peripheral edge 70b of the second bump 70, and the fifth surface 50a of the second dielectric layer 50. The second protective layer 80 is electrically connected with the second bump 70, as shown in FIG. 3.

The solder mask layer 90 is provided with at least one first opening 91 and disposed on the eighth surface 80a of the second protective layer 80. The first opening 91 of the solder mask layer 90 is for allowing the second protective layer 80 to be exposed, as shown in FIG. 3. At least one bonding pad 61 is formed on the conductive circuit 60 at an area corresponding to the first opening 91 for external electrical connection. The bonding pad 61 is protected by the second bump 70 and the second protective layer 80.

As shown in FIG. 1, while performing wire bonding, a first bonding point 81 and a second bonding point 4a are respectively formed on the second protective layer 80 and an electronic component 4 by a bonding wire 3 for electrically connecting the chip package 1 with the electronic component 4.

Refer to FIG. 1, FIG. 2, and FIG. 4-17, a method of manufacturing the chip package 1 according to the present invention includes the following steps.

Figure 4:
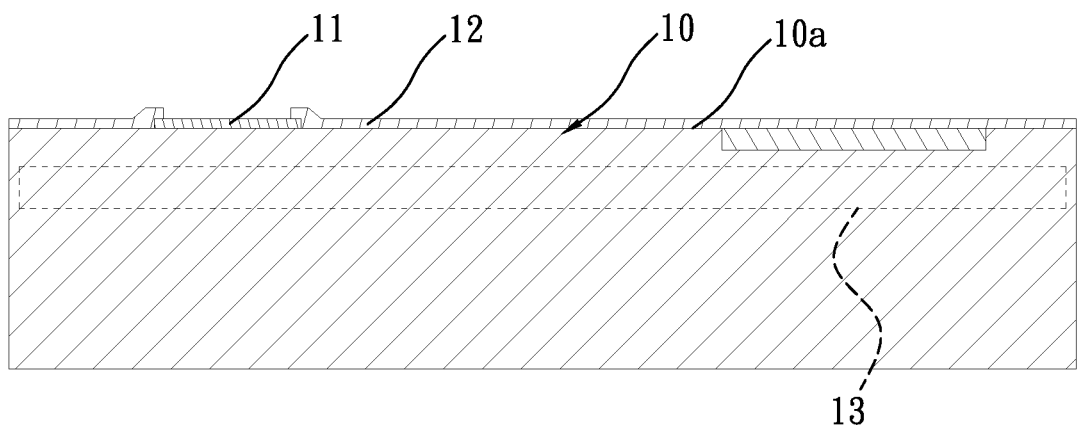
FIG. 4 is a sectional view showing a chip of an embodiment according to the present invention.

Step S1: providing a wafer 2 which includes a plurality of chips 10 arranged in an array, as shown in FIG. 2, and each of the chips 10 is provided with and at least one internal circuit 13 and a first surface 10a on which at least one die pad 11 and at least one protective layer 12 are disposed, as shown in FIG. 4.

Figure 5:
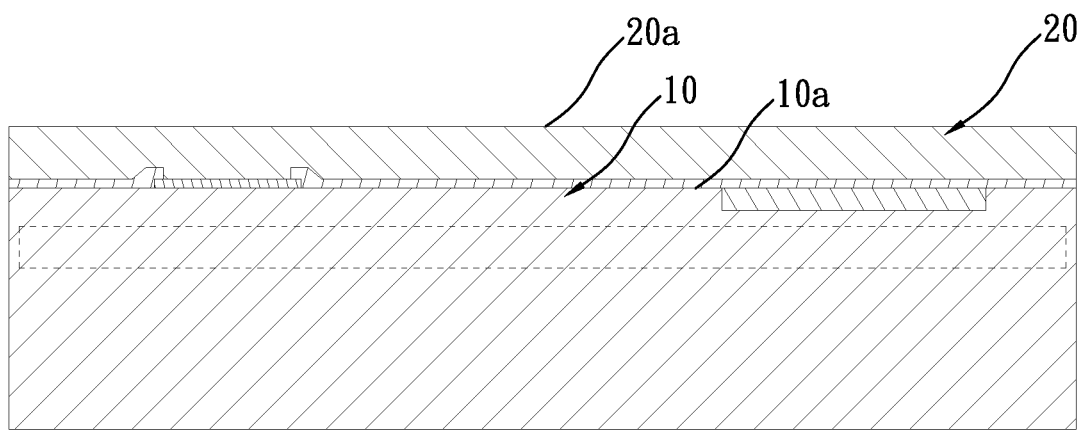
FIG. 5 is a schematic drawing showing the chip in FIG. 4 provided with a first dielectric layer according to the present invention.

Step S2: disposing at least one first dielectric layer 20 over the first surface 10a of the chip 10 while the first dielectric layer 20 is covering the first surface 10a correspondingly and provided with a second surface 20a, as shown in FIG. 5.

Figure 6:
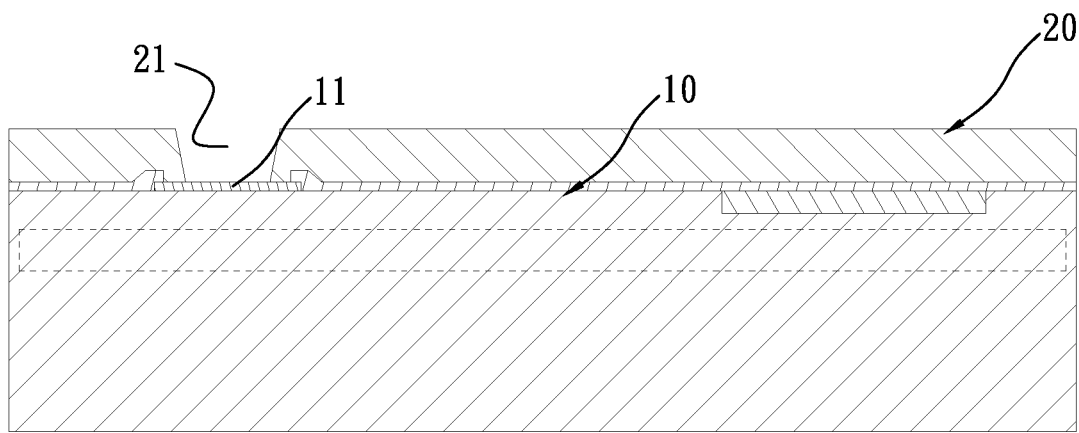
FIG. 6 is a schematic drawing showing a first groove formed on the first dielectric layer in FIG. 5 according to the present invention.

Step S3: forming at least one first groove 21 on the first dielectric layer and the first groove 21 is corresponding to the die pad 11 of the chip 10, as shown in FIG. 6.

Figure 7:
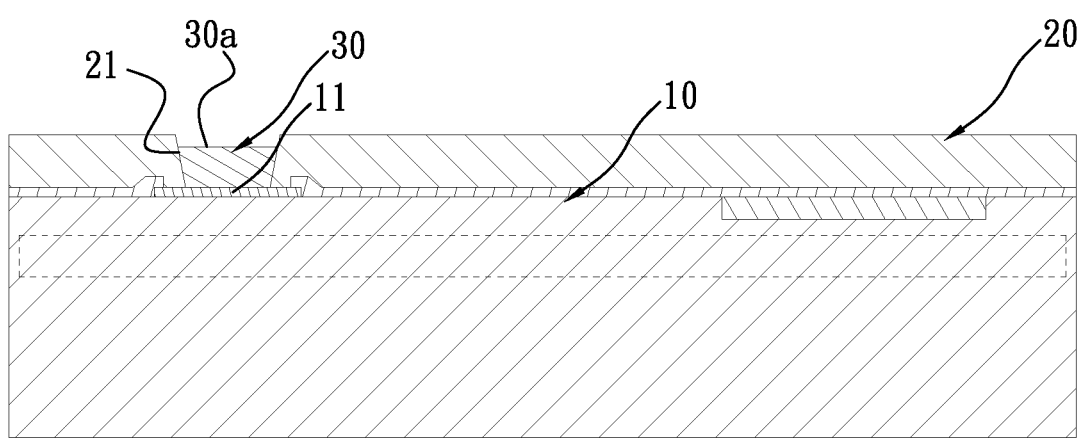
FIG. 7 is a schematic drawing showing a first bump mounted in the first groove in FIG. 6 according to the present invention.

Step S4: mounting at least one first bump 30 in the first groove 21 of the first dielectric layer 20 while the first bump 30 is disposed on and electrically connected with the die pad 11 of the chip 10 and provided with a third surface 30a, as shown in FIG. 7.

Figure 8:
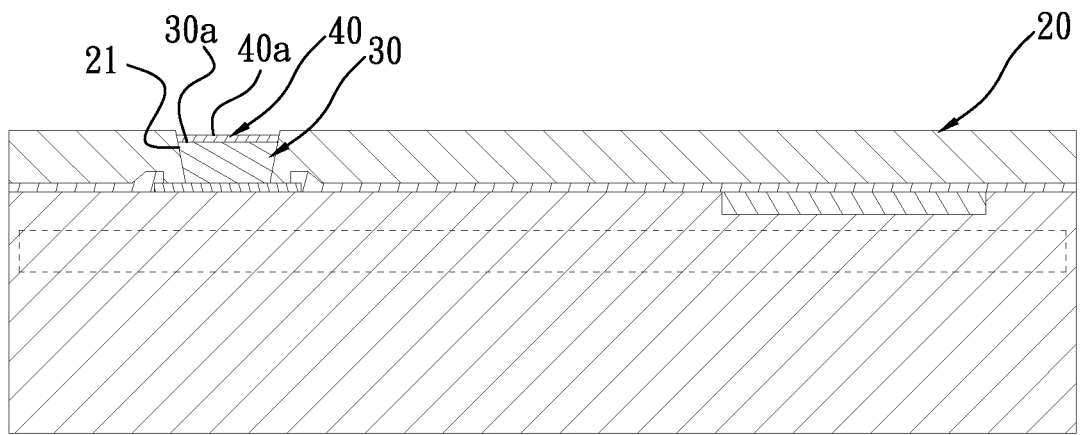
FIG. 8 is a schematic drawing showing a first protective layer disposed in the first groove in FIG. 7 according to the present invention.

Step S5: disposing at least one first protective layer 40 in the first groove 21 of the first dielectric layer 20 while the first protective layer 40 is not only electrically connected with and arranged at the third surface 30a of the first bump 30 but also provided with a fourth surface 40a, as shown in FIG. 8.

Figure 9:
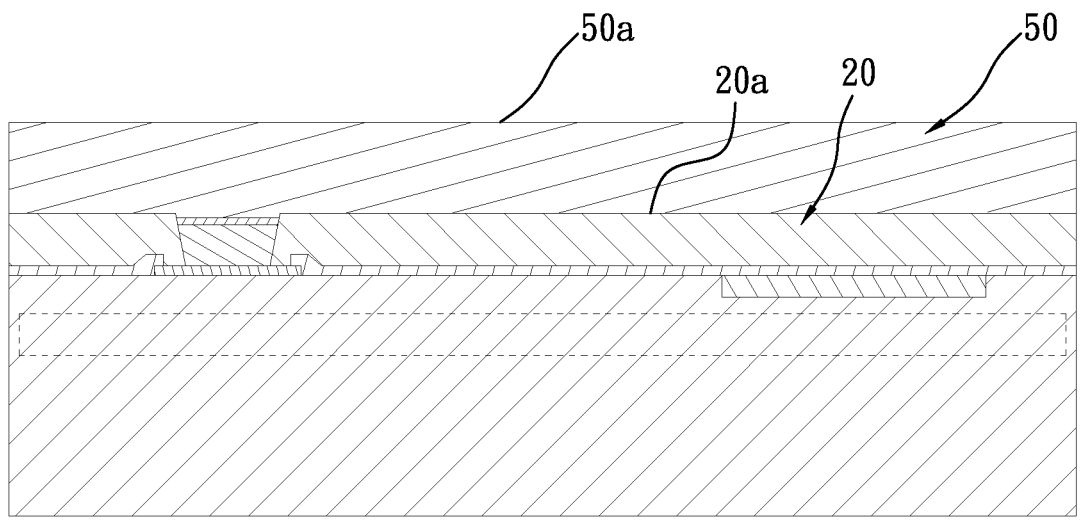
FIG. 9 is a schematic drawing showing a second dielectric layer disposed over a second surface of a first dielectric layer in FIG. 8 according to the present invention.

Step S6: arranging at least one second dielectric layer 50 over the second surface 20a of the first dielectric layer 20 and the second dielectric layer 50 is covering the second surface 20a correspondingly and provided with a fifth surface 50a, as shown in FIG. 9.

Figure 10:
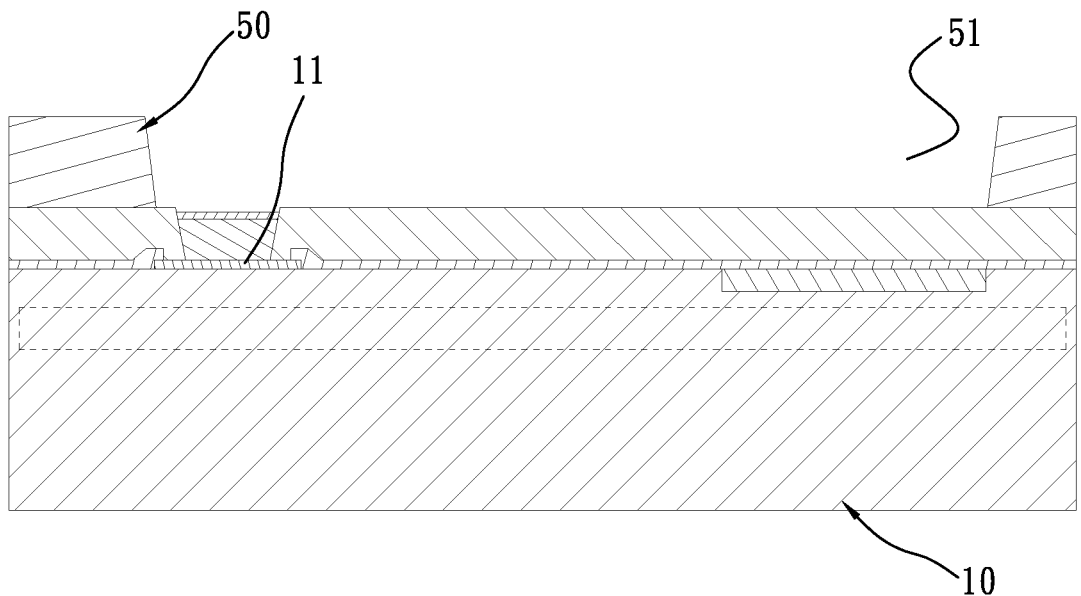
FIG. 10 is a schematic drawing showing a second groove formed on the second dielectric layer in FIG. 9 according to the present invention.

Step S7: forming at least one second groove 51 on the second dielectric layer 50 and the die pad 11 of the chip 10 is covered by the second groove 51, as shown in FIG. 10.

Figure 11:
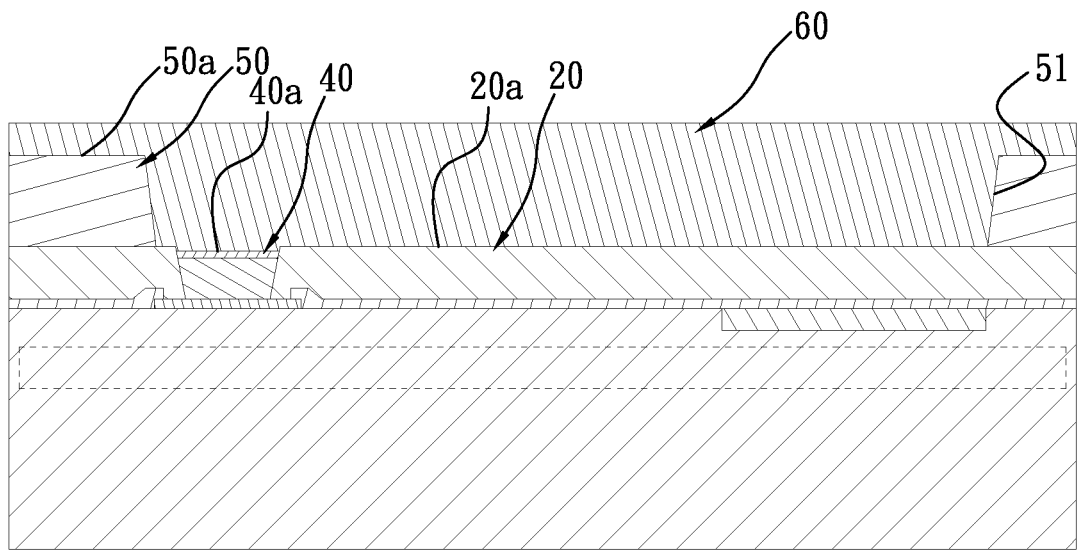
FIG. 11 is a schematic drawing showing a conductive circuit mounted in the second groove in FIG. 10 according to the present invention.

Step S8: mounting at least one conductive circuit 60 in the second groove 51 of the second dielectric layer 50 while the conductive circuit 60 is electrically connected with the first protective layer 40 and arranged at the second surface 20a of the first dielectric layer 20, the fourth surface 40a of the first protective layer 40, and the fifth surface 50a of the second dielectric layer 50, as shown in FIG. 11.

Figure 12:
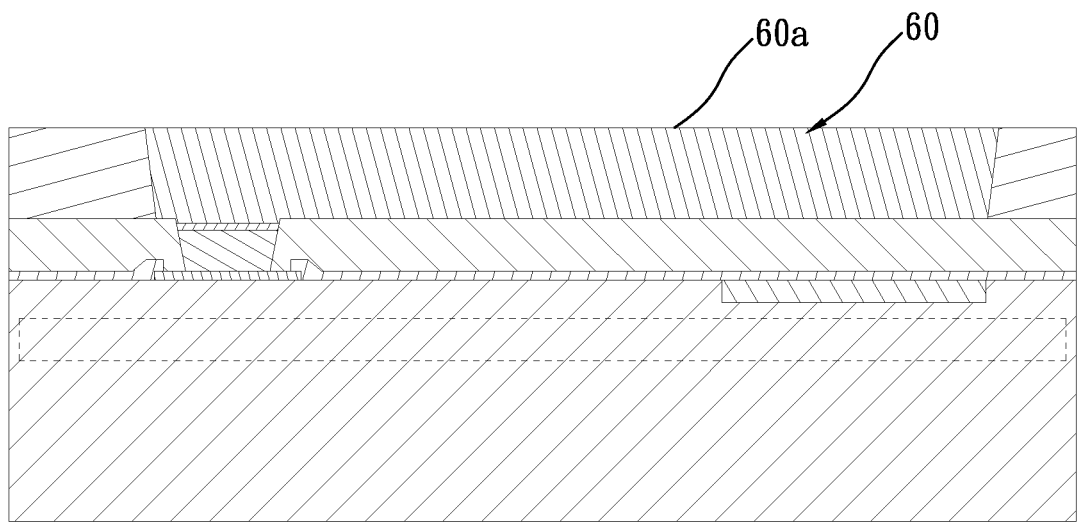
FIG. 12 is a schematic drawing showing redundant part of the conductive circuit in FIG. 11 is removed by wire grinding according to the present invention.

Step S9: removing redundant part of the conductive circuit 60 by wire grinding. As shown in FIG. 12, now the conductive circuit 60 is having a sixth surface 60a.

Figure 13:
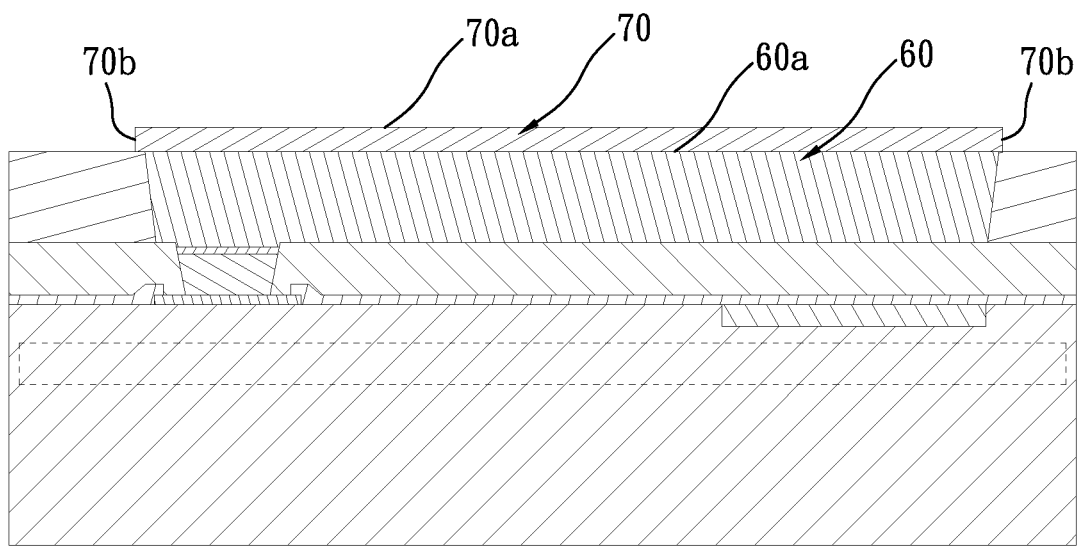
FIG. 13 is a schematic drawing showing a second bump disposed over a sixth surface of the conductive circuit in FIG. 12 according to the present invention.

Step S10: disposing at least one second bump 70 over the sixth surface 60a of the conductive circuit 60 while the second bump 70 is electrically connected with the conductive circuit 60 and provided with a seventh surface 70a and a peripheral edge 70b, as shown in FIG. 13.

Figure 14:
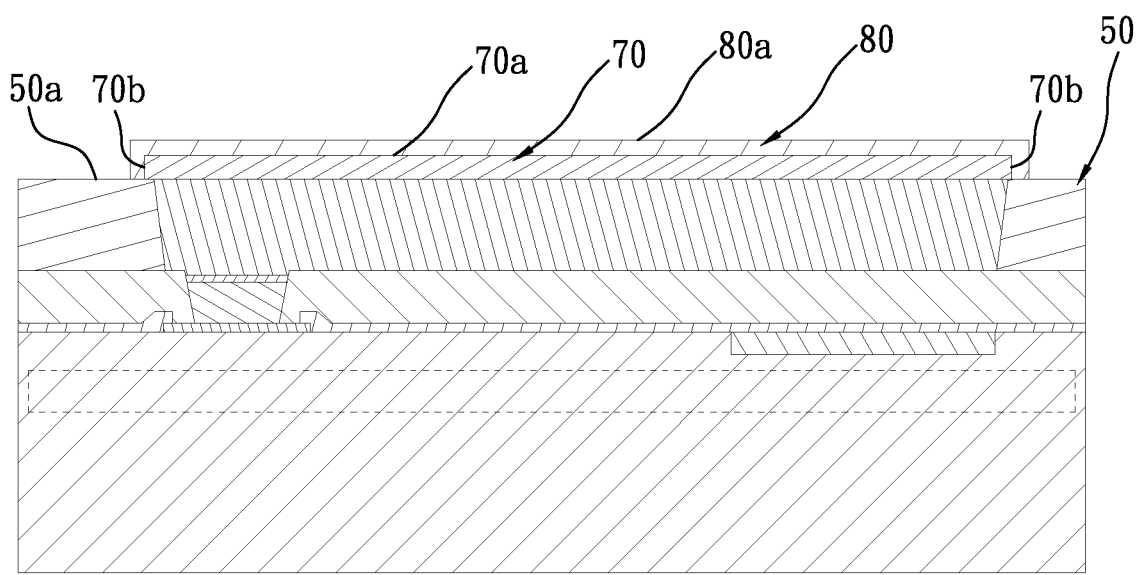
FIG. 14 is a schematic drawing showing a second protective layer arranged at the second bump in FIG. 13 according to the present invention.

Step S11: arranging at least one second protective layer 80 over the seventh surface 70a of the second bump 70 while the second protective layer 80 is electrically connected with the second bump 70, disposed on the peripheral edge 70b of the second bump 70, and the fifth surface 50a of the second dielectric layer 50, and provided with an eighth surface 80a, as shown in FIG. 14.

Figure 15:
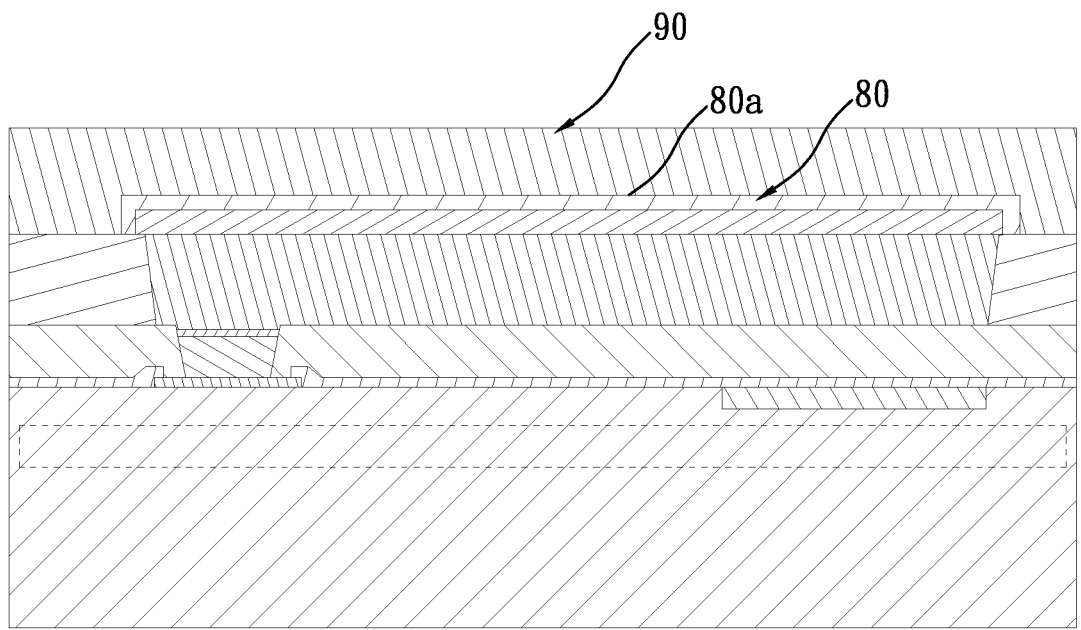
FIG. 15 is a schematic drawing showing a solder mask layer mounted over an eighth surface of the second protective layer in FIG. 14 according to the present invention.

Step S12: mounting at least one solder mask layer 90 over the eighth surface 80a of the second protective layer 80, as shown in FIG. 15.

Figure 16:
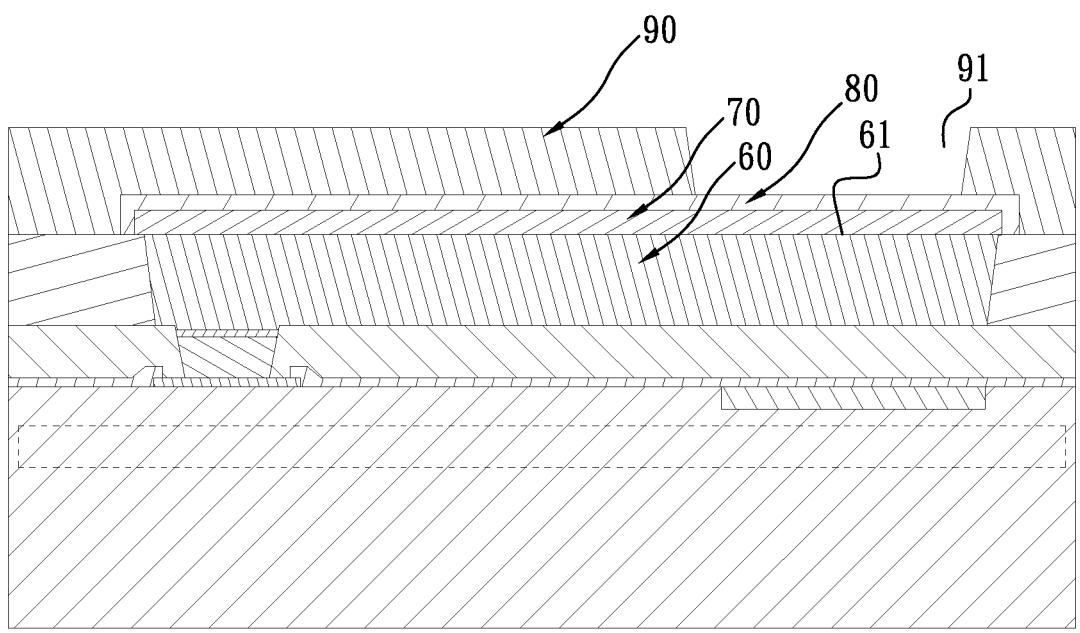
FIG. 16 is a schematic drawing showing a first opening formed on the solder mask layer in FIG. 15 according to the present invention.

Step S13: forming at least one first opening 91 on the solder mask layer 90 so that the second protective layer 80 is exposed through the first opening 91 of the solder mask layer 90, as shown in FIG. 16. At least one bonding pad 61 is formed on the conductive circuit 60 at an area corresponding to the first opening 91 for external electrical connection, as shown in FIG. 16.

Step S14: cutting the plurality of chips 10 of the wafer 2 to separate the respective chip packages 1 from the wafer 2, as shown in FIG. 2.

Step S15: performing wire bonding on the respective (separated) chip packages 1 and using a bonding wire 3 to form a first bonding point 81 and a second bonding point 4*a* respectively on the second protective layer 80 and an electronic component for electrically connecting the chip package 1 with the electronic component 4, as shown in FIG. 1.

The conductive circuit 60 is a structure with a certain thickness which is set to 4.5-20 μm. Thereby structural strength of the conductive circuit 60 is improved and able to stand a positive pressure N generated in wire bonding or formation of the first bonding point 81, as shown in FIG. 1. The internal circuit 13 of the chip 13 will not be damaged by the positive pressure N (as show in FIG. 1). As shown in FIG. 19, the internal circuit 13 is allowed to pass through an area under the first bonding point 81, or arrange under the first bonding point 81. The thickness of the conductive circuit 60 can be further set to, but not limited to, 4.5-5 μm.

Refer to FIG. 3, the solder mask layer 90 is further provided with a ninth surface 90*a*, but not limited. The chip package 1 further includes at least one outer protective layer 100 having a second opening 101 which is communicating with the first opening 91 of the solder mask layer 90. The outer protective layer 100 is disposed on and covering the ninth surface 90*a* of the solder mask layer 90 correspondingly and the second opening 101 of the outer protective layer 100 is used for allowing the second protective layer 80 to be exposed.

Figure 20:
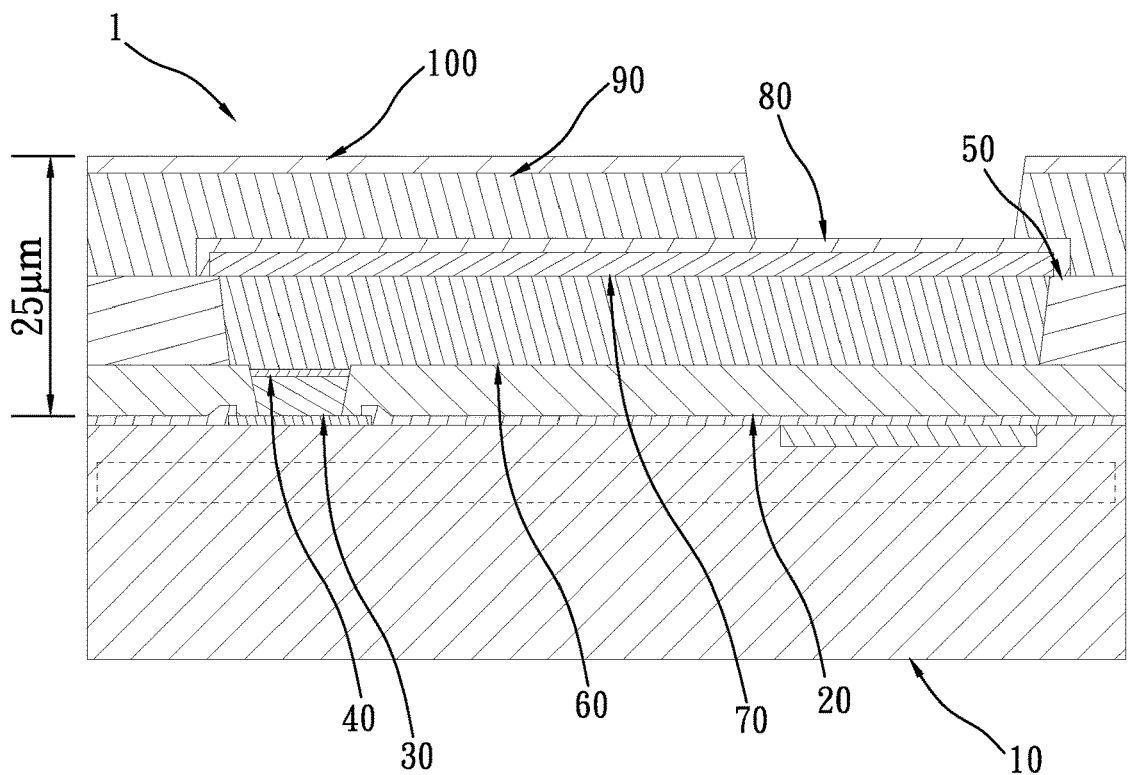
FIG. 20 is a side sectional view showing a chip package formed by a first dielectric layer, a first bump, a first protective layer, a second dielectric layer, a conductive circuit, a second bump, a second protective layer, a solder mask layer, and an outer protective layer stacked over one another wand having a total thickness of 25 μm of an embodiment according to the present invention.

As shown in FIG. 20, a total thickness of an assembly formed by the first dielectric layer 20, the first bump 30, the first protective layer 40, the second dielectric layer 50, the conductive circuit 60, the second bump 70, the second protective layer 80, the solder mask layer 90, and the outer protective layer 100 stacked over one another is, but not limited to, 25 μm.

Figure 17:
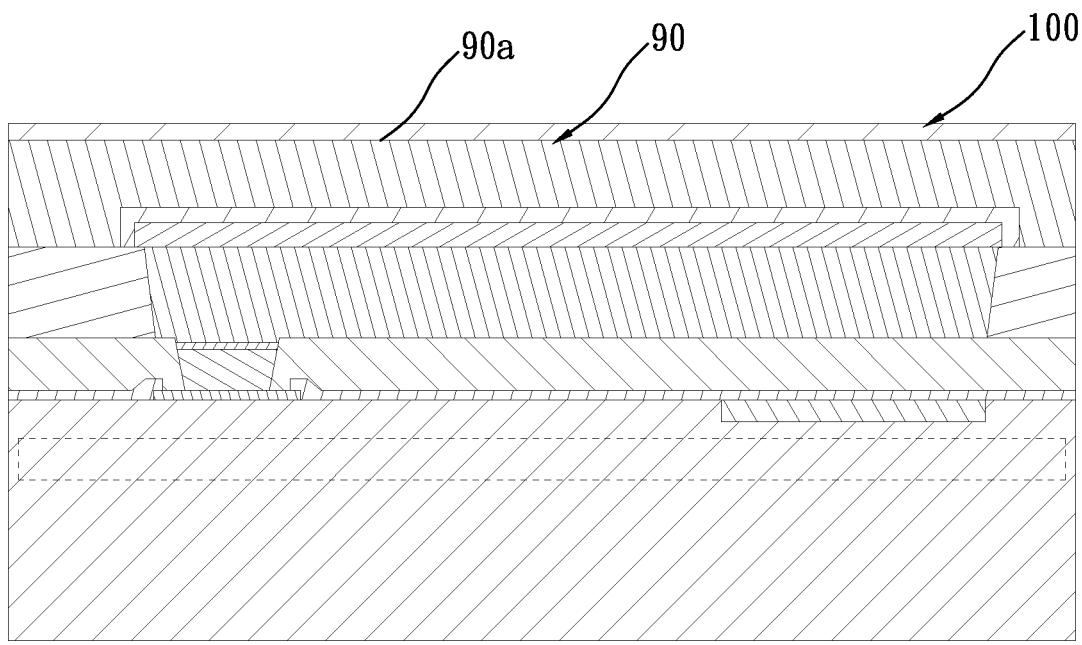
FIG. 17 is a schematic drawing showing an outer protective layer disposed over the solder mask layer in FIG. 16 according to the present invention.

Refer to FIG. 17, in the step S12, disposing at least one outer protective layer 100 over a ninth surface 90*a* of the solder mask layer 90 and the outer protective layer 100 is covering the ninth surface 90*a* of the solder mask layer 90.

Refer to FIG. 3, in the Step S13, at least one second opening 101 is formed on the outer protective layer 100 when the first opening 91 is formed on the solder mask layer 90 and the first opening 91 and the second opening 101 are communicating with each other.

Figure 21:
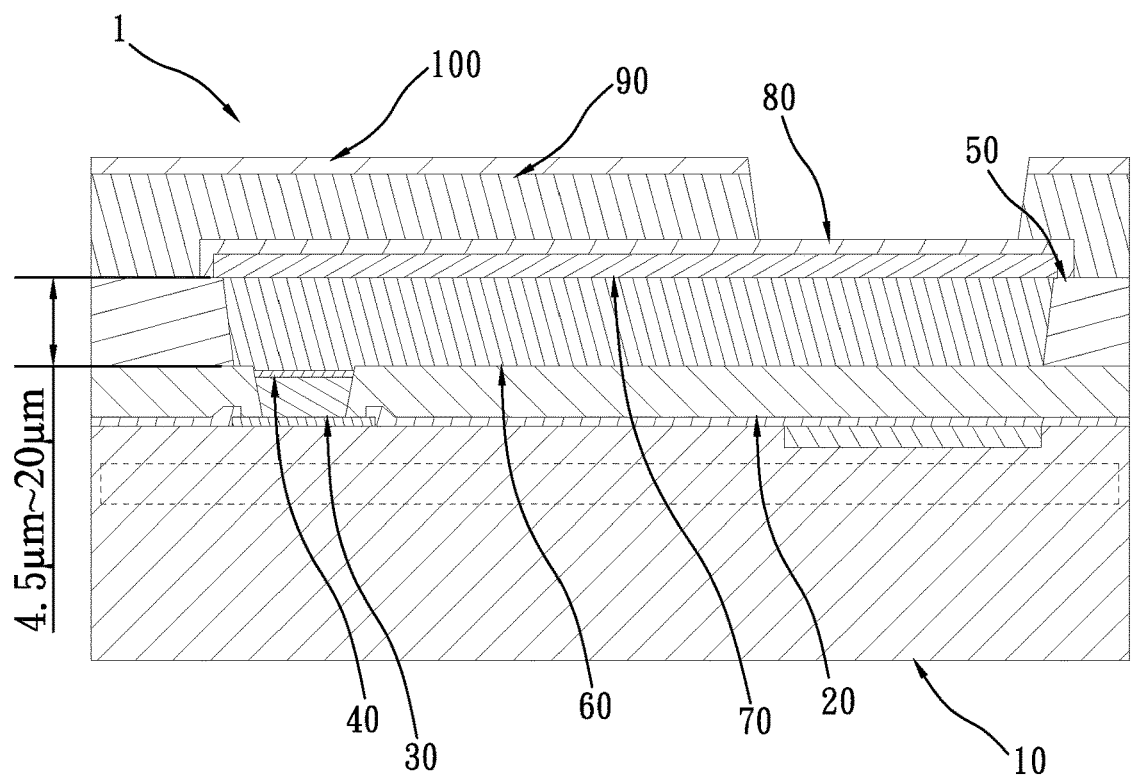
FIG. 21 is a side sectional view showing a thickness of a conductive circuit set to 4.5-20 μm of an embodiment according to the present invention.

Compared with the chip package available now, the chip package 1 according to the present invention has the following advantages. The conductive circuit 60 of the chip package 1 is a structure having a certain thickness set to 4.5-20 μm, as shown in FIG. 21. Thereby the structural strength of the conductive circuit 60 is enhanced to stand the positive pressure N (as shown in FIG. 1) generated in the wire bonding or formation of the first bonding point 81. Thus the internal circuit 13 of the chip 10 will not be damaged due to the positive pressure N (as shown in FIG. 1) and able to pass through an area under the first bonding point 81 or arrange under the first bonding point 81, as shown in FIG. 19. Therefore, the problem of increased cost caused by the internal circuit redesign of the chip at the manufacturing end can be solved effectively and this is beneficial to reduction of the cost at the manufacturing end.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A chip package having higher bearing capacity in wire bonding comprising:
    a chip having at least one internal circuit and a first surface provided with at least one die pad and at least one protective layer; wherein the chip is formed by cutting a wafer;
    at least one first dielectric layer which is composed of a second surface and at least one first groove; the first dielectric layer is disposed on and covering the first surface of the chip correspondingly while the first groove is corresponding to the die pad of the chip;
    at least one first bump which is provided with a third surface, mounted in the first groove of the first dielectric layer, and arranged at and electrically connected with the die pad on the chip;
    at least one first protective layer which is having a fourth surface, mounted in the first groove of the first dielectric layer, and disposed on and electrically connected with the third surface of the first bump;
    at least one second dielectric layer which includes a fifth surface and at least one second groove; the second dielectric layer is disposed on and covering the second surface of the first dielectric layer while the die pad of the chip is covered by the second groove;
    at least one conductive circuit which is provided with a sixth surface and ounted in the second groove of the second dielectric layer; the conductive circuit is disposed on the second surface of the first dielectric layer, the fourth surface of the first protective layer, and the fifth surface of the second dielectric layer; wherein the conductive circuit is electrically connected with the first protective layer;
    at least one second bump having a seventh surface and a peripheral edge and being mounted to and electrically connected with the sixth surface of the conductive circuit;
    at least one second protective layer which is provided with an eighth surface and arranged at the seventh surface of the second bump, the peripheral edge of the second bump, and the fifth surface of the second dielectric layer; the second protective layer is electrically connected with the second bump; and
    at least one solder mask layer having at least one first opening and disposed on the eighth surface of the second protective layer; the first opening of the solder mask layer is for allowing the second protective layer to be exposed; at least one bonding pad is mounted on the conductive circuit and corresponding to the first opening for external electrical connection;
    wherein while performing wire bonding, a first bonding point and a second bonding point are respectively formed on the second protective layer and an electronic component by a bonding wire for electrical connection between the chip package and the electronic component;
    wherein a method of manufacturing the chip package comprising the steps of:

Step S1: providing a wafer which includes a plurality of chips arranged in an array and each of the chips having a first surface and at least one internal circuit while the first surface is provided with at least one die pad and at least one protective layer;

Step S2: disposing at least one first dielectric layer over the first surface of the chip and the first dielectric layer is covering the first surface correspondingly and provided with a second surface;

Step S3: forming at least one first groove on the first dielectric layer and the first groove is corresponding to the die pad of the chip;

Step S4: mounting at least one first bump in the first groove of the first dielectric layer while the first bump having a third surface is disposed on and electrically connected with the die pad of the chip;

Step S5: disposing at least one first protective layer in the first groove of the first dielectric layer while the first protective layer having a fourth surface is disposed on and electrically connected with the third surface of the first bump;

Step S6: arranging at least one second dielectric layer over the second surface of the first dielectric layer while the second dielectric layer is covering the second surface correspondingly and provided with a fifth surface;

Step S7: forming at least one second groove on the second dielectric layer and the die pad of the chip is covered by the second groove;

Step S8: mounting at least one conductive circuit in the second groove of the second dielectric layer while the conductive circuit is arranged at the second surface of the first dielectric layer, the fourth surface of the first protective layer, and the fifth surface of the second dielectric layer; wherein the conductive circuit is electrically connected with the first protective layer;

Step S9: removing redundant part of the conductive circuit by wire grinding and the conductive circuit is having a sixth surface;

Step S10: disposing at least one second bump over the sixth surface of the conductive circuit while the second bump is electrically connected with the conductive circuit and provided with a seventh surface and a peripheral edge;

Step S11: arranging at least one second protective layer over the seventh surface of the second bump while the second protective layer is electrically connected with the second bump, having an eighth surface, and located at the peripheral edge of the second bump, and the fifth surface of the second dielectric layer;

Step S12: mounting at least one solder mask layer over the eighth surface of the second protective layer;

Step S13: forming at least one first opening on the solder mask layer so that the second protective layer is exposed through the first opening of the solder mask layer; wherein at least one bonding pad is formed on the conductive circuit at an area corresponding to the first opening for external electrical connection;

Step S14: cutting the plurality of chips of the wafer to separate the respective chip packages from the wafer; and Step S15: performing wire bonding on the respective separate chip packages and using a bonding wire to form a first bonding point and a second bonding point respectively on the second protective layer and an electronic component for electrical connection between the chip package and the electronic component;

wherein the conductive circuit is a structure with a thickness which is set to 4.5-20 µm; thereby structural strength of the conductive circuit is improved and able stand a positive pressure generated in wire bonding or formation of the first bonding point; the internal circuit of the chip will not be damaged by the positive pressure and the internal circuit is further allowed to pass through an area under the first bonding point or arrange under the first bonding point.

2. The chip package as claimed in claim 1, wherein the thickness of the conductive circuit is further set to 4.5-5 µm.

3. The chip package as claimed in claim 1, wherein the solder mask layer is further provided with a ninth surface while the chip package further includes at least one outer protective layer having a second opening which is communicating with the first opening of the solder mask layer; wherein the outer protective layer is disposed on and covering the ninth surface of the solder mask layer and the second opening of the outer protective layer is used for allowing the second protective layer to be exposed.

4. The chip package as claimed in claim 3, wherein a total thickness of the chip package formed by the first dielectric layer, the first bump, the first protective layer, the second dielectric layer, the conductive circuit, the second bump, the second protective layer, the solder mask layer, and the outer protective layer stacked over one another is 25 µm.

5. The chip package as claimed in claim 1, wherein in the step S12, at least one outer protective layer is disposed over a ninth surface of the solder mask layer and the outer protective layer is covering the ninth surface of the solder mask layer.

6. The chip package as claimed in claim 5, wherein in the step S13, at least one second opening on the outer protective layer is formed when the first opening is formed on the solder mask layer; wherein the first opening and the second opening are communicating with each other.

* * * * *